United States Patent
Lin

(10) Patent No.: US 7,793,246 B2
(45) Date of Patent: Sep. 7, 2010

(54) METHOD FOR FORMING MATCHING TABLE OF INNER PADS AND OUTER PADS AND METHOD FOR MATCHING INNER PADS WITH OUTER PADS USING THE SAME

(75) Inventor: Chih-Chiang Lin, Taichung (TW)

(73) Assignee: Wintek Corporation, Taichung (TW)

( * ) Notice: Subject to any disclaimer, the term of this patent is extended or adjusted under 35 U.S.C. 154(b) by 546 days.

(21) Appl. No.: 11/889,790

(22) Filed: Aug. 16, 2007

(65) Prior Publication Data
US 2008/0044933 A1 Feb. 21, 2008

(30) Foreign Application Priority Data
Aug. 21, 2006 (TW) .............................. 95130712 A

(51) Int. Cl.
*G06F 17/50* (2006.01)

(52) U.S. Cl. .............................. 716/9; 716/10; 716/11

(58) Field of Classification Search ................. 716/4–5, 716/9–11, 19
See application file for complete search history.

(56) References Cited

U.S. PATENT DOCUMENTS 7,062,741 B1 * 6/2006 Leng et al. ..................... 716/11

* cited by examiner

*Primary Examiner*—Paul Dinh
(74) *Attorney, Agent, or Firm*—Bacon & Thomas, PLLC

(57) ABSTRACT

A method for forming a matching table of inner pads and outer pads includes the steps of: obtaining a pitch $P_i$ and a space $S_i$ between two neighboring inner pads; computing $W_{im} = m \times P_i - S_i$; obtaining a pitch $P_o$ and a space $S_o$ between two neighboring outer pads; computing $W_{on} = n \times P_o - S_o$; computing $R_n = W_{on} + (S_o \times C)$; comparing $W_{im}$ with $R_1$ to $R_Y$; and recording the number of the outer pads matching with the m inner pads as j when $W_{im}$ is smaller than or equal to $R_j$ and greater than $R_{j-1}$.

18 Claims, 4 Drawing Sheets

METHOD FOR FORMING MATCHING TABLE OF INNER PADS AND OUTER PADS AND METHOD FOR MATCHING INNER PADS WITH OUTER PADS USING THE SAME

This application claims the benefit of Taiwan application Serial No. 95130712, filed Aug. 21, 2006, the subject matter of which is incorporated herein by reference.

BACKGROUND OF THE INVENTION

1. Field of the Invention

The invention relates in general to a method for matching inner pads with outer pads, and more particularly to a method for forming a matching table of inner pads and outer pads of a display module, and a method for matching the inner pads with the outer pads using the matching table.

2. Description of the Related Art

With the progress of the industry in the display apparatus, the requirements on the display quality of the display apparatus and the design and production speeds are getting higher and higher. At present, the circuit layout on the display module is designed according to several important conditions. For example, the impedance of the power pad is preferably smaller, so the impedance specification thereof is within 50 Ohms; and the external capacitor pad is preferably small, so the impedance specification thereof is within 100 Ohms. The layout designer has to do try and error according to the experience to find the optimum number of outer pads corresponding to each set of inner pads for connection so as to achieve the specified specification. When the number of inner pads is too great, this layout work consumes a lot of labor, time and costs. In addition, the design error frequently occurs so that the pads on the edge are over shifted, the pitch of the connection is too long and the impedance is too high, thereby influencing the display quality of the display module.

SUMMARY OF THE INVENTION

The invention is directed to a method for forming a matching table of inner pads and outer pads and a method of matching the inner pads with the outer pads using the same. The matching table records a matching relationship between the number of inner pads and the number of outer pads so that the designer can perform the layout rapidly and the time of design can be shortened. Meanwhile, this layout method enables the ratios of the inner pads to the outer pads to be uniformly distributed, so the display effect of the overall display module can be enhanced.

According to a first aspect of the present invention, a method of forming a matching table between inner pads and outer pads is provided. The method includes the steps of: obtaining a pitch $P_i$ and a space $S_i$ between two neighboring inner pads, wherein $P_i$ equals a sum of $S_i$ and a width of the inner pad; computing, by using a computer, $W_{im}=m \times P_i - S_i$, wherein $W_{im}$ is a total width of m neighboring inner pads having the same function, m=1 to X, X is the number of the inner pads, and m and X are positive integers; obtaining a pitch $P_o$ and a space $S_o$ between the two neighboring outer pads, wherein $P_o$ equals a sum of $S_o$ and a width of the outer pad; computing $W_{on}=n \times P_o - S_o$, wherein $W_{on}$ is a total width of n outer pads, n=1 to Y, Y is the number of the outer pads, and n and Y are positive integers; computing $R_n=W_{on}+(S_o \times C)$, wherein C is a real number; comparing $W_{im}$ with $R_1$ to $R_Y$; and recording the number of the outer pads matching with the m inner pads as j when $W_{im}$ is smaller than or equal to $R_j$ and greater than $R_{j-1}$, wherein j is a positive integer and j=2 to Y.

According to a second aspect of the present invention, a method of matching inner pads with outer pads is provided. The method includes the steps of: providing A neighboring inner pads having the same function, wherein A is a positive integer; providing a matching table of the inner pads and the outer pads, the matching table recording a matching relationship between the number of the inner pads and the number of the outer pads; and obtaining the number of the outer pads matching with the A inner pads as B according to the matching table and A.

According to a third aspect of the present invention, a display module formed by a manufacturing method is provided. The method includes the steps of: providing a display panel having a first inner pad set and a plurality of outer pads, the first inner pad set having A neighboring inner pads with the same function; providing a matching table of the inner pads and the outer pads, the matching table recording a matching relationship between the number of the inner pads and the number of the outer pads; obtaining the number of the outer pads matching with the A inner pads as B according to the matching table and A, wherein B is a positive integer; and electrically connecting the A inner pads to the B outer pads.

The invention will become apparent from the following detailed description of the preferred but non-limiting embodiments. The following description is made with reference to the accompanying drawings.

DETAILED DESCRIPTION OF THE INVENTION

Figure 1:
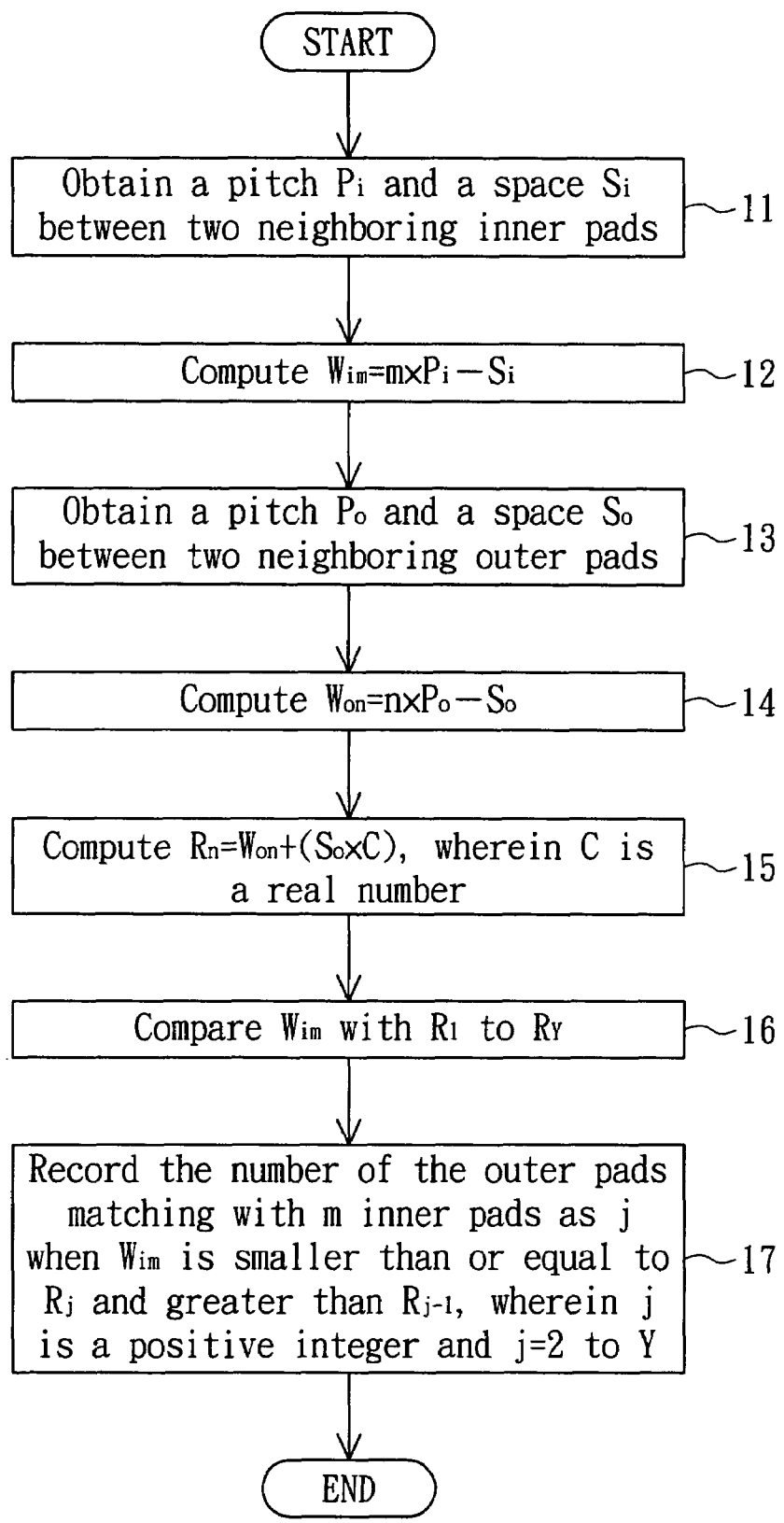
FIG. 1 is a flow chart showing a method of forming a matching table according to the invention.
Figure 2:
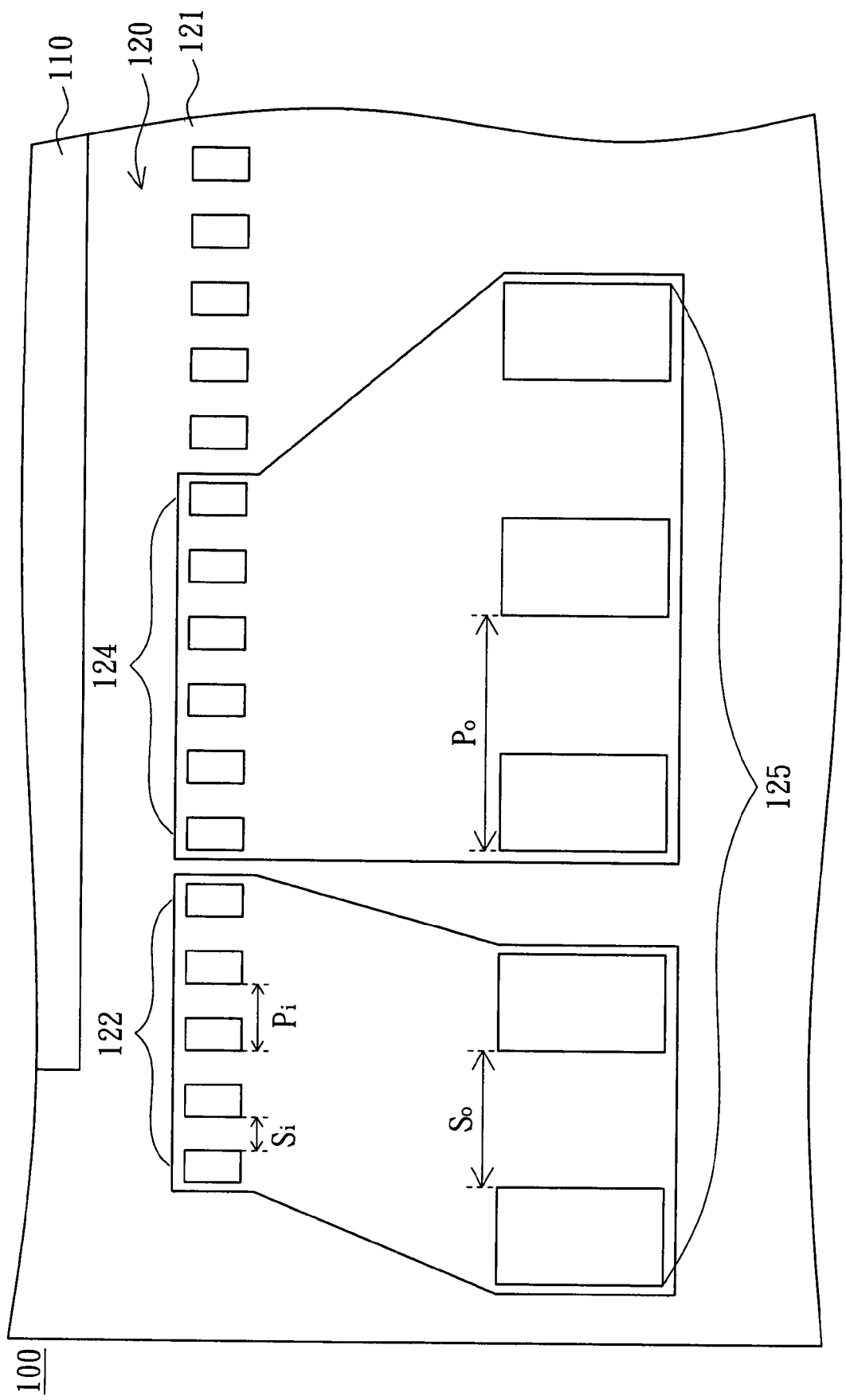
FIG. 2 is a schematic plane view showing a display module.

FIG. 1 is a flow chart showing a method of forming a matching table according to the invention. FIG. 2 is a schematic plane view showing a display module. Referring to FIGS. 1 and 2, the display module, such as a liquid crystal display module 100, includes a liquid crystal display panel composed of a color filter substrate 110 and a thin film transistor substrate 120 assembled together. Inner pads and outer pads 125 are disposed on an active surface 121 of the thin film transistor substrate 120, wherein the inner pads include multiple power pads 122 and multiple external capacitor pads 124.

Referring to FIG. 1, a pitch $P_i$ and a space $S_i$ between two neighboring inner pads are obtained in step 11, wherein $P_i$ equals a sum of $S_i$ and a width of the inner pad. In this embodiment, the pitch $P_i$ is 60, and the space $S_i$ is 20, for example.

Next, $W_{im}=m \times P_i - S_i$ is computed in step 12, wherein $W_{im}$ is a total width of m neighboring inner pads having the same function, m=1 to X, X is the number of inner pads, and m and X are positive integers. In this embodiment, the total widths of the m inner pad(s) with m=1 to 20 are listed in Table 1.

TABLE 1

| m | Total width $W_{im}$ of inner pads |
|---|---|
| 1 | 40 |
| 2 | 100 |

TABLE 1-continued

| m | Total width $W_{im}$ of inner pads |
|---|---|
| 3 | 160 |
| 4 | 220 |
| 5 | 280 |
| 6 | 340 |
| 7 | 400 |
| 8 | 460 |
| 9 | 520 |
| 10 | 580 |
| 11 | 640 |
| 12 | 700 |
| 13 | 760 |
| 14 | 820 |
| 15 | 880 |
| 16 | 940 |
| 17 | 1000 |
| 18 | 1060 |
| 19 | 1120 |
| 20 | 1180 |

Then, a pitch $P_o$ and a space $S_o$ between two neighboring outer pads are obtained in step 13, wherein $P_o$ equals a sum of $S_o$ and a width of the outer pad. In this embodiment, the pitch $P_o$ is 150, and the space $S_o$ is 75, for example.

Next, $W_{on}=n\times P_o-S_o$ is computed in step 14, wherein $W_{on}$ equals a total width of n outer pads, n=1 to Y, Y is the number of the outer pads, Y has no upper bound, and n and Y are positive integers. In this embodiment, the total widths of the n outer pad(s) with n=1 to 8 and Y=8 are listed in Table 2.

TABLE 2

| n | Total width $W_{on}$ of outer pads |
|---|---|
| 1 | 75 |
| 2 | 225 |
| 3 | 375 |
| 4 | 525 |
| 5 | 675 |
| 6 | 825 |
| 7 | 975 |
| 8 | 1125 |

Then, $R_n=W_{on}+(S_o\times C)$ is computed in step 15, wherein C is a real number, and $R_n$ defines a reference range during the design phase. In this embodiment, when n=1, C=1 and thus $R_1=W_{o1}+S_o$; and when n is greater than 1, C=1.5 and thus $R_n=W_{on}+(S_o\times 1.5)$. According to the above-mentioned rule, the reference ranges $R_n$ and the total widths $W_{on}$ of the n outer pad(s) with n=1 to 8 are listed in Table 3.

TABLE 3

| n | Total width $W_{on}$ of outer pads | Reference range $R_n$ |
|---|---|---|
| 1 | 75 | 150 |
| 2 | 225 | 337.5 |
| 3 | 375 | 487.5 |
| 4 | 525 | 637.5 |
| 5 | 675 | 787.5 |
| 6 | 825 | 937.5 |
| 7 | 975 | 1087.5 |
| 8 | 1125 | 1237.5 |

Next, $W_{im}$ is compared with $R_1$ to $R_Y$ in step 16. The comparison table is shown in Table 4.

TABLE 4

| m | total width $W_{im}$ of inner pads | n | Reference range $R_n$ |
|---|---|---|---|
| 1 | 40 | 1 | 150 |
| 2 | 100 | 2 | 337.5 |
| 3 | 160 | 3 | 487.5 |
| 4 | 220 | 4 | 637.5 |
| 5 | 280 | 5 | 787.5 |
| 6 | 340 | 6 | 937.5 |
| 7 | 400 | 7 | 1087.5 |
| 8 | 460 | 8 | 1237.5 |

Next, the number of the outer pads matching with the m inner pads is recorded as j in step 17 when $W_{im}$ is smaller than or equal to $R_j$ and greater than $R_{j-1}$, wherein j is a positive integer and j=2 to Y; and the number of the outer pads matching with the m inner pads is recorded as 1 when $W_{im}$ is smaller than $R_1$ in the matching table. In this embodiment, the total widths of the m (=1 to 2) inner pad(s) are smaller than $R_1$=150, so one or two inner pads match with one outer pad 125. When m=3, the total widths $W_{i3}$=160 of the inner pads are greater than $R_1$=150 and smaller than $R_2$=337.5, so three inner pads have to match with two outer pads 125. Thus, the above-mentioned step is repeated so that a matching table can be computed. In this embodiment, assume X=20, the following matching table is listed in Table 5.

TABLE 5

| Number of inner pads | Number of matched outer pads |
|---|---|
| 1 | 1 |
| 2 | 1 |
| 3 | 2 |
| 4 | 2 |
| 5 | 2 |
| 6 | 3 |
| 7 | 3 |
| 8 | 3 |
| 9 | 4 |
| 10 | 4 |
| 11 | 5 |
| 12 | 5 |
| 13 | 5 |
| 14 | 6 |
| 15 | 6 |
| 16 | 7 |
| 17 | 7 |
| 18 | 7 |
| 19 | 8 |
| 20 | 8 |

For example, as shown in FIG. 2, the display module 100 has five power pads 122 and six external capacitor pads 124. According to Table 5, the five power pads 122 match with and are electrically connected to the two outer pads 125. Similarly, the six external capacitor pads 124 match with and are electrically connected to the three outer pads 125.

However, one of ordinary skill in the art may easily understand that the technology of the invention is not limited thereto. For example, when $W_{im}$ is equal to $R_j$, m inner pads may match with j outer pads, and the inner pads may be electrically connected to the outer pads by way of indium tin oxide (ITO) or indium zinc oxide (IZO) coating.

Figure 3:
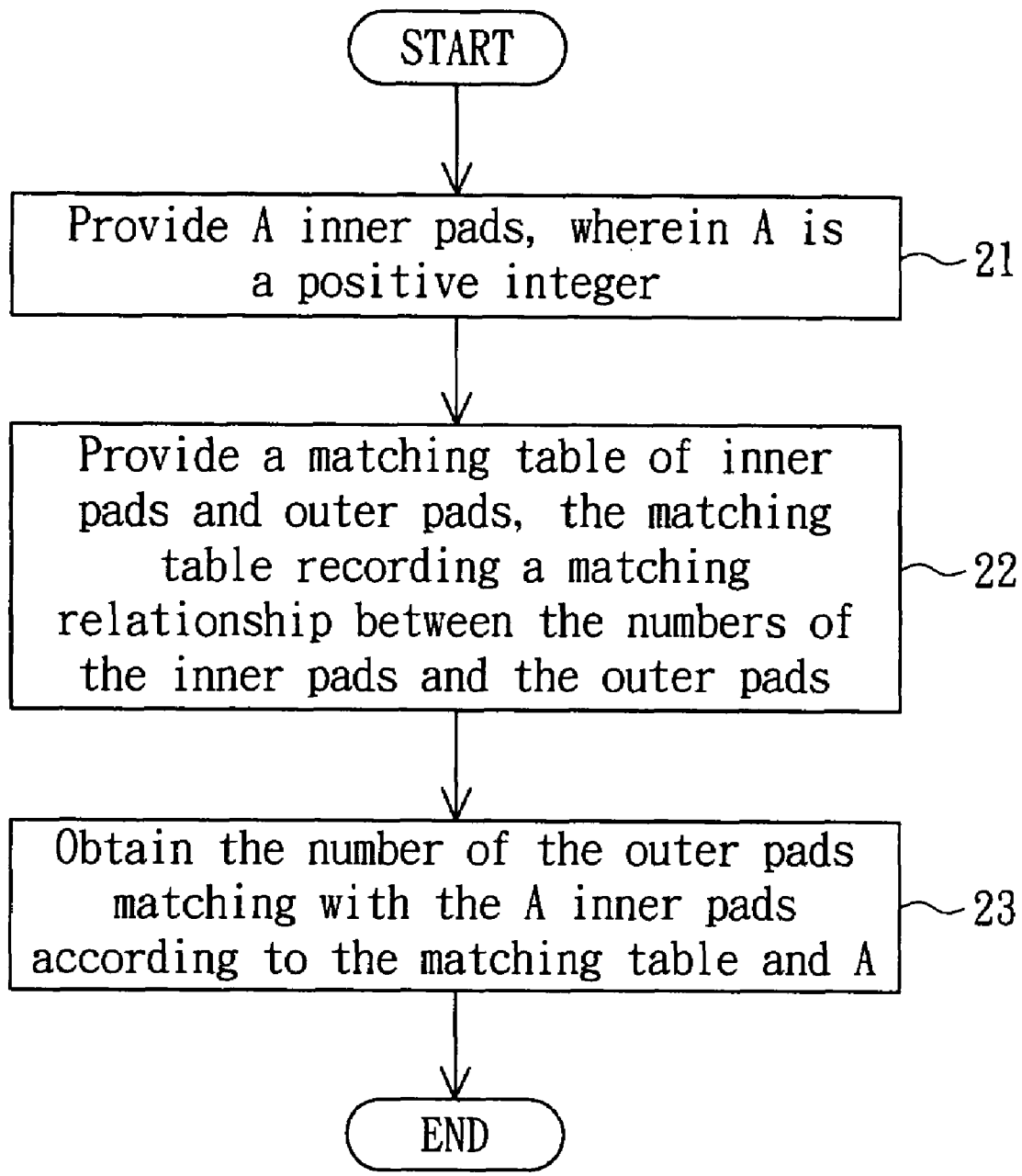
FIG. 3 is a flow chart showing a method of matching inner pads with outer pads according to the invention.

Thus, the invention can provide a method for matching the inner pads with the outer pads. FIG. 3 is a flow chart showing a method of matching the inner pads with the outer pads according to the invention. Referring to FIG. 3, A inner pads are provided in step 21, wherein A is a positive integer. The inner pads may be, for example, the power pads 122 of FIG. 2, and A=5; or may be the external capacitor pads 124, and A=6.

Next, a matching table of the inner pads and the outer pads is provided in step 22, wherein the matching table records the matching relationship between the number of the inner pads and the number of the outer pads.

Then, the number of the outer pads matching with the A inner pads is obtained as B in step 23 according to the matching table and A. The outer pads may be the outer pads 125 of FIG. 2, so the power pads 122 and the external capacitor pads 124 on the liquid crystal display module 100 may match with the outer pads 125 according to Table 5. As shown in Table 5, the corresponding number of the outer pads 125 is 2 when A=5; and the corresponding number of the outer pads 125 is 3 when A=6. Then, it is possible to electrically connect the power pads 122 and the external capacitor pads 124 to the outer pads 125 by way of, for example, ITO or IZO coating according to the matching relationship.

Figure 4:
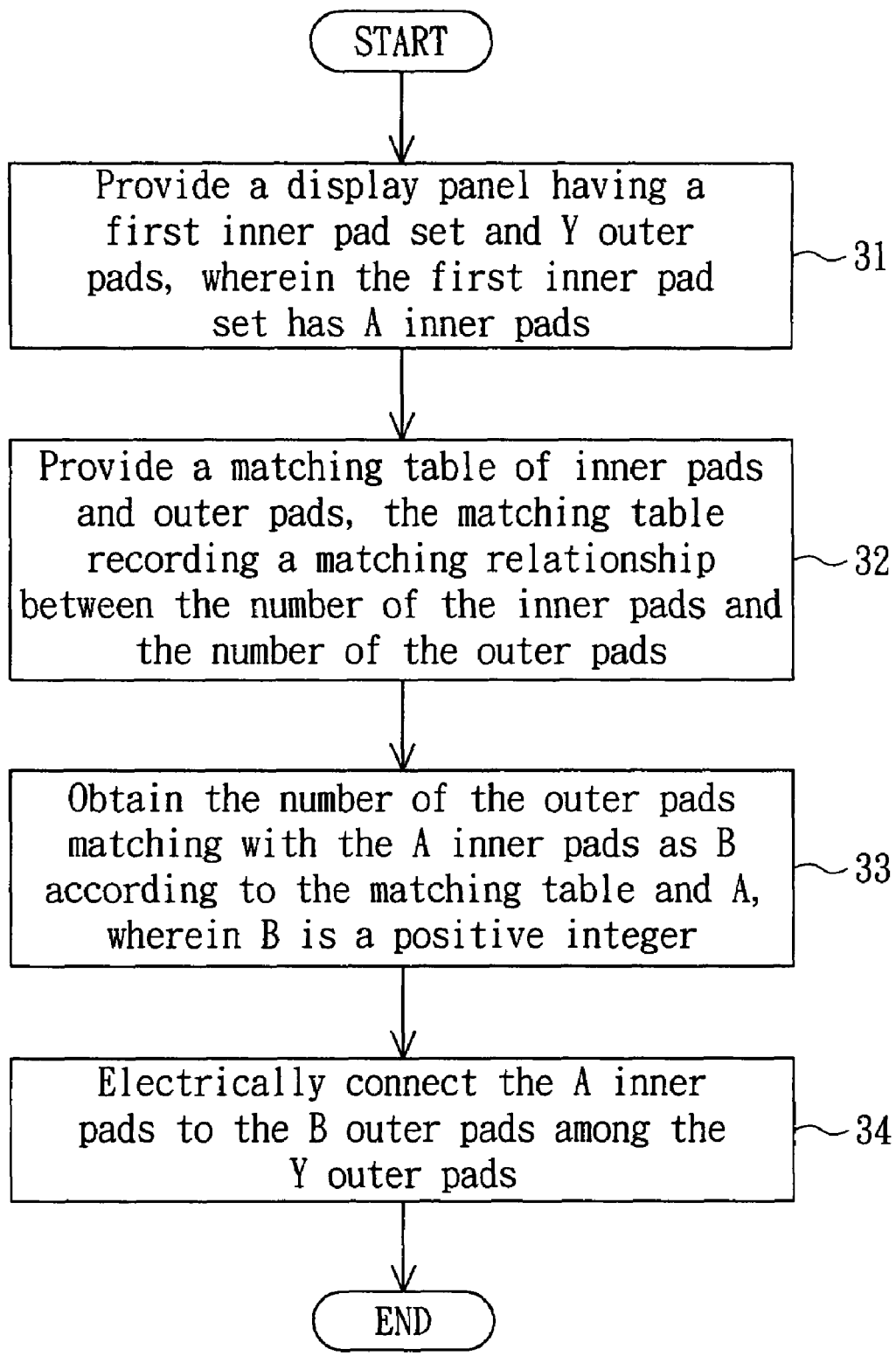
FIG. 4 is a flow chart showing a method of manufacturing the display module according to the invention.

Similarly, the display module may also be manufactured according to Table 5. FIG. 4 is a flow chart showing a method of manufacturing the display module according to the invention. First, a display panel having a first inner pad set and Y outer pads is provided in step 31, wherein the first inner pad set has A inner pads. The display panel may be, for example, the liquid crystal display panel of FIG. 2 composed of the color filter substrate 110 and the thin film transistor substrate 120 combined together. Multiple inner pads and outer pads 125 are disposed on the active surface 121 of the thin film transistor substrate 120, wherein the inner pads may be the power pads 122 corresponding to A=5, or the external capacitor pads 124 corresponding to A=6.

Next, a matching table of the inner pads and the outer pads is provided in step 32, wherein the matching table records the matching relationship between the number of the inner pads and the number of the outer pads.

Then, the number of the outer pads matching with the A inner pads is obtained as B in step 33 according to the matching table and A, wherein B is a positive integer. Thus, the power pads 122 and the external capacitor pads 124 disposed on the active surface 121 of the thin film transistor substrate 120 may match with the outer pads 125 according to Table 5. As shown in Table 5, the corresponding number of the outer pads 125 is B=2 when A=5, and the corresponding number of the outer pads 125 is B=3 when A=6.

Next, the A inner pads are electrically connected to the B outer pads among the Y outer pads in step 34. Thus, the five power pads 122 may be electrically connected to the two outer pads 125, and the six external capacitor pads 124 may be electrically connected to the three outer pads 125 by way of, for example, ITO or IZO coating.

In addition, if other inner pad sets, which have functions different from those of the inner pad set of the power pads 122 or the capacitor pads 124, are disposed on the thin film transistor substrate 120 of the liquid crystal display panel and the inner pads of the other inner pad sets are also arranged adjacently, then the corresponding number of the outer pads 125 matching with the other inner pad sets can be found according to the matching table of the inner pads and the outer pads using a method the same as that for the inner pad set of the power pads 122 or the capacitor pads 124.

It is possible to compute the total widths of the various numbers of the inner pads and the total widths of the various numbers of the outer pads through equations in the method of forming the matching table of the inner pads and the outer pads and the method of matching the inner pads with the outer pads using the same according to the embodiments of the invention. Then, the total widths of the various numbers of the inner pads are compared with the designed reference ranges obtained through computing the equations so that the numbers of the outer pads corresponding to various numbers of the inner pads can be obtained, and a matching table can be obtained. It is possible to find the suitable number of the outer pads matching with the inner pad sets having different functions and disposed on the display panel according to the matching table. Compared with the conventional design method of try and error, the problem of redundant outer pads can be eliminated. Even if the pitch or space between the pads varies under different specifications, the designer can create the matching table rapidly and perform the layout according to the table. In addition, because the matching ratios are uniform and can meet the specification, the designed display module can have the stable efficiency so that the display performance can be enhanced.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a matching table of inner pads and outer pads in a circuit layout,
the method comprising the steps of:
obtaining a pitch $P_i$ and a space $S_i$ between two neighboring inner pads,
wherein $P_i$ equals a sum of $S_i$ and a width of the inner pad;
computing, by using a computer, $W_{im}=m \times P_i - S_i$, wherein $W_{im}$ is a total width of m neighboring inner pads having the same function, m=1 to X, X is the number of the inner pads, and m and X are positive integers;
obtaining a pitch $P_0$ and a space $S_0$ between the two neighboring outer pads, wherein $P_0$ equals a sum of $S_0$ and a width of the outer pad;
computing $W_{on}=n \times P_0 - S_0$, wherein $W_{on}$ is a total width of n outer pads, n=1 to Y, Y is the number of the outer pads, and n and Y are positive integers;
computing $R_n = W_{on} + (S_o \times C)$, wherein C is a real number and $R_n$ defines a reference range for n=1 to Y;
comparing $W_{im}$ with $R_j$; wherein $R_j=R_n$ for n=j, j is a positive integer and j=2 to Y, to determine whether $W_{im}$ is smaller than or equal to $R_j$ and greater than $R_{j-1}$; and
recording the number of the outer pads matching with the m inner pads as j when $W_{im}$ is smaller than or equal to $R_j$.

2. The method according to claim 1, further comprising the step of:
recording the number of the outer pads matching with the m inner pads as K when $W_{im}$ is equal to RK, K=1 to Y and K is a positive integer.

3. The method according to claim 1, further comprising the steps of:
recording the number of the outer pads matching with the m inner pads as 1 when $W_{im}$ is smaller than R1.

4. The method according to claim 1, wherein when n=1, C=1 and thus R1=W01+S0.

5. The method according to claim 1, wherein when n is greater than 1, C=1.5 and thus Rn=W0(S0×1.5).

6. A method of matching inner pads with outer pads in a circuit layout, the method comprising the steps of:

providing A neighboring inner pads having the same function, wherein A is a positive integer;

providing a matching table of the inner pads and the outer pads, the matching table recording a matching relationship between the number of the inner pads and the number of the outer pads; and obtaining the number of the outer pads matching with the A inner pads as B according to the matching table and A, wherein the matching table is formed by the steps of:

obtaining a pitch Pi and a space Si between two neighboring inner pads, wherein Pi equals a sum of Si and a width of the inner pad;

computing, by using a computer, $W_{im}=m \times Pi-Si$, wherein $W_{im}$ is a total width of m neighboring inner pads having the same function, X is the number of the inner pads, m and X are positive integers, and m=1 to X;

obtaining a pitch $P_O$ and a space $S_O$ between the two neighboring outer pads;

computing $W_{on}=n \times P_0-S_0$, wherein $W_{on}$ is a total width of n outer pads, Y is the number of the outer pads, n and Y are positive integers, and n=1 to Y;

computing $R_n=W_{on}+(S_o \times C)$, wherein C is a real number and $R_n$ defines a reference range for n=1 to Y;

comparing $W_{im}$ with $R_j$; wherein $R_j=R_n$ for n=j, j is a positive integer and j=2 to Y to determine whether $W_{im}$ is smaller than or equal to $R_j$ and greater than $R_{j-1}$; and recording the number of the outer pads matching with the m inner pads as j when $W_{im}$ is smaller than or equal to $R_j$.

7. The method according to claim 6, wherein the matching table is formed further by the step of:

recording the number of the outer pads matching with the m inner pads as K when $W_{im}$ is equal to RK, K=1 to Y and K is a positive integer.

8. The method according to claim 6, wherein the matching table is formed further by the step of:

recording the number of the outer pads matching with the m inner pads as 1 when $W_{im}$, is smaller than $R_1$.

9. The method according to claim 6, wherein when n=1, C=1 and thus $R_1=W_{01}+S_0$.

10. The method according to claim 6, wherein when n is greater than 1, C=1.5 and thus $R_n=W_0(S_0 \times 1.5)$.

11. The method according to claim 6, further comprising the steps of:

electrically connecting the A inner pads to the B outer pads.

12. A display module formed by a manufacturing method, the method comprising the steps of:

providing a display panel having a first inner pad set and a plurality of outer pads, the first inner pad set having A neighboring inner pads with the same function;

providing a matching table of the inner pads and the outer pads, the matching table recording a matching relationship between the number of the inner pads and the number of the outer pads;

obtaining the number of the outer pads matching with the A inner pads as B according to the matching table and A, wherein B is a positive integer; and electrically connecting the A inner pads to the B outer pads, wherein the matching table is formed by the steps of:

obtaining a pitch $P_i$ and a space $S_i$ between two neighboring inner pads, wherein $P_i$ equals a sum of $S_i$ and a width of the inner pad;

computing, by using a computer, $W_{im}=m \times P_t-S_i$, wherein $W_{im}$ is a total width of m neighboring inner pads having the same function, X is the number of the inner pads, m and X are positive integers, and m=1 to X;

obtaining a pitch $P_0$ and a space $S_0$ between the two neighboring outer pads, wherein $P_0$ equals a sum of $S_0$ and a width of the outer pad;

computing $W_{on}=n \times P_0-S_0$, wherein $W_{on}$ is a total width of n outer pads, Y is the number of the outer pads, n and Y are positive integers, and n=1 to Y;

computing $R_n=W_{on}+(S_o \times C)$, wherein C is a real number and $R_n$ defines a reference range for n=1 to Y;

comparing $W_{im}$ with $R_j$; wherein $R_j=R_n$ for n=j, j is a positive integer, and j=2 to Y, to determine whether $W_{im}$ is smaller than or equal to $R_j$ and greater than $R_{j-1}$;

matching the m inner pads with the j outer pads when $W_{im}$ is smaller than or equal to $R_j$ and greater than $R_{j-1}$; and recording the m inner pads matching with the j outer pads.

13. The display module according to claim 12, wherein the matching table is formed further by the step of:

matching the m inner pads with the j outer pads when $W_{im}$ is equal to $R_j$.

14. The display module according to claim 12, wherein the matching table is formed further by the step of:

matching the m inner pads with the one outer pad when $W_{im}$, is smaller than $R_1$.

15. The display module according to claim 12, wherein in the step of forming the matching table, when n=1, C=1 and thus $R_1=W_{01}+S_0$.

16. The display module according to claim 12, wherein in the step of forming the matching table, when n is greater than 1, C=1.5 and thus $R_n=W_0(S_0 \times 1.5)$.

17. The display module according to claim 12, wherein the display panel is a liquid crystal display panel.

18. The display module according to claim 12, wherein the display panel further has a plurality of inner pad sets having function different from that of the first inner pad set, inner pads of the inner pad sets are arranged adjacently, the corresponding number of the outer pads matching with the inner pad sets can be found according to the matching table of the inner pads and the outer pads using a method the same as that for the first inner pad set.

\* \* \* \* \*